United States Patent [19]

Beneking

[11] 4,137,543

[45] Jan. 30, 1979

[54] LIGHT DETECTOR ARRANGEMENT

[75] Inventor: Heinz Beneking, Aachen, Germany

[73] Assignee: Licentia Patent Verwaltungs GmbH, Frankfurt am Main, Germany

[21] Appl. No.: 796,536

[22] Filed: May 13, 1977

[30] Foreign Application Priority Data

Jun. 1, 1976 [DE] Fed. Rep. of Germany ....... 2624436

[51] Int. Cl.² .................. H01L 27/14; H01L 29/161
[52] U.S. Cl. ........................................... 357/30; 357/16; 357/15; 357/19; 350/96.30; 350/96.12; 250/551; 250/227
[58] Field of Search ................... 357/30, 16, 15, 19; 350/96 WG; 250/551, 227

[56] References Cited

U.S. PATENT DOCUMENTS

| | | | |
|---|---|---|---|
| 3,801,391 | 4/1974 | Dyment | 156/16 |
| 3,833,435 | 9/1974 | Logan | 156/11 |
| 3,896,305 | 7/1975 | Ostrowsky | 250/227 |
| 3,952,265 | 4/1976 | Hunsperger | 331/94.5 |
| 4,053,914 | 10/1977 | Goodwin | 357/17 |

Primary Examiner—Martin H. Edlow
Attorney, Agent, or Firm—Spencer & Kaye

[57] ABSTRACT

A light detector arrangement comprises three semiconductor layers, one on top of another, the center layer guiding the light and the layers on opposite sides of the center layer having a lower dielectric constant, the arrangement being provided with a first detector electrode on a side surface of the layers and a second detector electrode on the outer surface of one of the outer layers, and adjacent the first electrode.

14 Claims, 4 Drawing Figures

LIGHT DETECTOR ARRANGEMENT

BACKGROUND OF THE INVENTION

The invention relates to a light wave conductor with a detector connected thereto, in which the light is guided in a first semiconductive layer which is arranged between two further semiconductive layers and the material of these layers has a larger dielectric constant than the bordering semiconductive layers.

Proposals have already been made for guiding light in a certain layer of a semiconductor arrangement. For example, triple-layer semiconductor arrangements having different dielectric constants from layer to layer are used for this. The light is guided, for example, in the centre layer of three epitaxially deposited semiconductive layers. The semiconductive layers bordering the photoconductive layer comprise a material, the dielectric constant of which is smaller than that of the photoconductive layer. In this way the light is prevented from leaving the photoconductive layer. A photodiode is used, for example, for the purpose of detection, this diode being arranged at the end of a light circuit of this type. There are two essential problems here which are to be solved by the present invention. In the arrangement which has been proposed the light at the boundary surface between the lighting circuit and the light detector is reflected, so that the efficiency of the entire arrangement is reduced. Moreover, only one specific avalanche diode may be used for light detection, as, until now, it was the only one which had the desired short response time.

SUMMARY OF THE INVENTION

It is an object on which the invention is to provide a light wave conductor with a detector connected thereto, in which, on the one hand, light reflection is diminished, and on the other hand, conventional components may be used for light detection.

According to a first aspect of the invention, there is provided a light detector arrangement comprising a first semiconductor layer for receiving light, second and third semiconductor layers on opposite sides of said first semiconductor layer of smaller dielectric constant than said first layer, a first detector electrode arranged at a side surface containing edges of said first, second and third semiconductor layers and a second detector on an outer face of one of said second or third semiconductor layers and in the proximity of said first detector electrode.

According to a second aspect of the invention, there is provided a light wave conductor with a detector connected thereto, in which the light is passed in a first semiconductor layer, said layer being arranged between two further semiconductor layers and the material of which layers has a larger dielectric constant than the bordering semiconductor layers, characterized in that at least one first connecting electrode for said detector element is arranged at the side surface of the semiconductor arrangement made up of semiconductor layers lying one on top of another while a second connecting electrode is arranged in proximity to said first electrode on the uppermost semiconductor layer.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
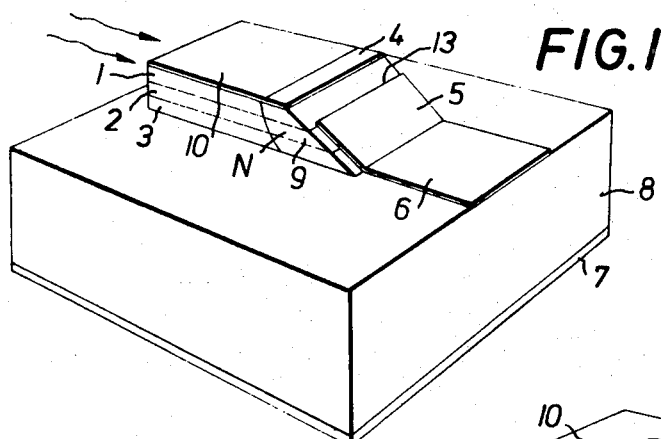
FIG. 1 shows in diagrammatic perspective view, a first embodiment of the invention.

In accordance with a preferred embodiment of the invention, in a semiconductor arrangement of the type described at the outset at least one first connecting electrode is provided for the detector element on the side surface of the semiconductor arrangement made up of semiconductive layers lying one on top of each other, while a second connecting electrode is arranged on the uppermost semiconductive layer close to the first electrode.

As a result of the close proximity of the connecting electrodes of the detector element, the propagation time of the charge carrier is greatly reduced and thus the response time of the detector is diminished decisively. Moreover, the arrangement may be so constructed that the light guided in the photoconductive layer terminates directly in the region of the detector, where the charge carrier pairs are produced, so that their path to the connecting electrodes of the detector is then extremely short.

The epitaxially produced semiconductive layers are arranged preferably one on top of each other on a substrate, in which the substrate comprises, for example a semi-insulating semiconductive material. The epitaxially produced semiconductor arrangement made up of the individual layers, each on top of the other, is constructed preferably as a strip and it drops down to the substrate at least at the point provided for the detector. The first connecting electrode of the detector is then located on the resultant side flank or surface of the multi-layer, epitaxial arrangement.

The necessary, eptaxially deposited semiconductive layers arranged one on top of each other are substantially undoped in a preferred embodiment and only contain the required concentrations of impurity in the region provided for the detector element. The light is coupled into the photoconductive layer preferably at the end of the photoconductor arrangement, for example formed as a strip, remote from the detector. Thus, the light may be focused on the photoconductive layer from free space or it may be concentrated on the end of the photoconductive layer via a prism. Moreover, other photoconductors may also be coupled to the photoconductive layer, or the light may be transmitted directly into the photoconductive layer from a light-transmissive component.

A Schottky diode, for example, comes into consideration as a detector. Then the multi-layer part of the semiconductor arrangement provided for the detector is so doped with impurities that a region of uniform type of conductivity is formed. The electrode arranged at the side flank of the layer sequence forms a rectifying metal-semiconductor contact with the doped semiconductor region. The second electrode, which is arranged on the uppermost epitaxially deposited layer in immediate proximity to the Schottky contact, however, forms a non-rectifying ohmic connecting contact with the doped semiconductive region. In a preferred embodiment the concentration of impurities of the doped semiconductive region decreases from the uppermost layer to the substrate. This doped semiconductor region may therefore be produced by means of diffusion and then has a concentration of impurities of approx. $10^{18}$ atoms/cm$^3$, for example, at the surface. This concentration decreases constantly towards the substrate to approximately $10^{15}$ to $10^{16}$ atoms/cm$^3$.

A diode having a PN junction also comes into consideration as a detector. In this case, the semiconductive region bordering on the first electrode of the detector on the side flank of the multi-layer semiconductor arrangement is doped with an impurity material producing a first type of conductivity. The semiconductive region bordering on the second electrode then has the opposite type of conductivity. so that a PN junction arises between the two doped semiconductive regions. The electrodes form non-rectifying ohmic connecting contacts with these semiconductive regions which are doped in a different manner.

Instead of a diode having a PN junction, a so-called PIN diode may also be used, the enlarged width of the barrier layer thereof being advantageous. In this diode, an intrinsic conductive semiconductor region is located between the two areas of different types of conductivity. The detector may also be constructed as a phototransistor. In this case the uppermost semiconductor layer has the first type of conductivity in the region provided for the detector. The layer lying therebelow and conducting the light is then doped in this region by impurities producing the second type of conductivity. The lowermost semiconductor layer in turn has the first type of conductivity. This lowermost semiconductor layer is connected with its doped region to the side flank of an ohmic connecting electrode which only contacts this layer. The central layer remains uncontacted while the uppermost layer is provided with the second ohmic connecting electrode. As this phototransistor is constructed from different semiconductor materials the so-called "wide-gap effect" is exploited by it.

Particularly in semiconductor arrangements in which the light detector is formed by a diode the semiconductor layers used comprise GaAs and GaAlAs.

Referring now the drawings, in the arrangement according to FIG. 1 a multi-layer strip form arrangement, which is epitaxially deposited and which forms the light wave conductor and the light detector, is located on a semi-insulating substrate 8. The lowermost layer 3 comprises Ga$_{0.7}$Al$_{0.3}$As, for example, and is undoped. A further epitaxially deposited layer 2 made of GaAs or Ga$_{0.9}$Al$_{0.1}$As is located on this layer 3. This layer too is also substantially undoped. In turn the uppermost layer 1 comprises Ga$_{0.7}$Al$_{0.3}$As, for example, and is also undoped. All layers have a thickness of 0.5 um, for example. With the stated materials of the different semiconductor layers, the dielectric constant of the layer 2 is larger than that of the layers 1 and 3. In this way it is ensured that the light is unable to escape from the layer 2 and is guided in this layer as far as the detector. The strip form semiconductor arrangement is provided with a flank or edge surface 13 running perpendicular or at an angle to the surface of the substrate 8 at its end provided for the detector, this flank 13 being produced, for example, by etching under a suitable mask. The semiconductor region 9 of the triple layer arrangement adjacent the flank 13 is N-doped for example. The impurities are diffused into these layers for example from above with the aid of suitable masks. A gradient of impurities is produced by diffusion so that a concentration of impurities of $10^{18}$ atoms/cm$^3$ prevails at the upper surface of the uppermost layer, said concentration decreasing to the substrate 8 to between $10^{15}$ to $10^{16}$ atoms/cm$^3$. This doped semiconductor region 9 is connected to an ohmic connecting contact 4 at the upper surface of the uppermost layer 1 at the edge of the flank 13, while a rectifying metal-semiconductor contact 5 is provided at the flank 13 itself. This rectifying metal-semiconductor contact 5 is produced for example by vapour depositing a layer made up of platinum or aluminium on to the flank 13 of the multi-layer arrangement. The largest field strength occurs at the upper edge of the Schottky contact during operation of the detector as a result of the gradient of impurities in the doped semiconductor region 9. The result of this is a relatively small path resistance in the most effective semiconductive region while the effective capacitance of the Schottky contact nevertheless remains relatively small since the space charge area starting from the Schottky contact is relatively wide in the weakly-doped regions of the semiconductor region 9. The limit frequency of the semiconductor arrangement shown is approximately 200 GHz.

The two contacts 4 and 5 may be transposed so that the rectifying Schottky contact is arranged on the upper surface of the uppermost semiconductor layer 1, while the ohmic connecting contact extends beyond the side flank of the multi-layer semiconductor arrangement. The rear side of the substrate 8, which comprises, for example, semi-insulating GaAs, is provided preferably with a conductor or line 7. It is possible in this way to use the material of the semiconductor foundation member 8 as a dielectric of a strip line. In this case a strip conductor 6 running on the semi-insulating substrate 8 starts from the connecting contact 5, said strip conductor forming a high-frequency strip line together with the conductor 7. The contact 4 may also merge into a strip conductor 10 which runs on the uppermost semiconductor layer 1 so that the strip conductors 10 and 7 together form a high-frequency strip line. The end of the photoconductor layer 2 opposite the detector serves to couple in the light and this may take place — as already stated — in different ways and therefore is not shown in greater detail.

The multi-layer photoconductor strip has a width of 0.4 mm for example. This width may be varied however according to the desired power. In order to detect the light the diode may be operated as a receiver diode without applied voltage, or the diode may be biased in a reverse direction, in which the blacking characteristic is altered by the incident light. There is also the possibility of controlling a diode operated in a reverse direction into the breakthrough region by means of multiplying the carriers.

Figure 2:
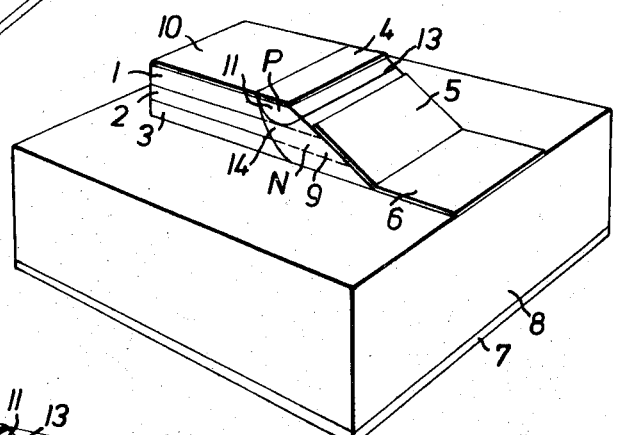
FIG. 2 is a view similar to FIG. 1 but showing a second embodiment of the invention.

A further semiconductor arrangement is shown in FIG. 2, which is distinguished from that of FIG. 1 only by the fact that a diode having a PN junction is used instead of a Schottky contact diode. The semi-conductor region bordering the flank 13 of the multi-layer semiconductor arrangement (1, 2, 3) is doped for this purpose so that the contact 4 is connected to a P conductive area 11 for example, while the contact 5 on the flank 13 is connected to the area 9 which is then N conductive. The two areas 9 and 11 are separated from each other by means of a PN junction 14; the electrodes 4 and 5 are ohmic connecting electrodes in this case, and they merge in turn into strip conductors 6 or 10.

Figure 3:
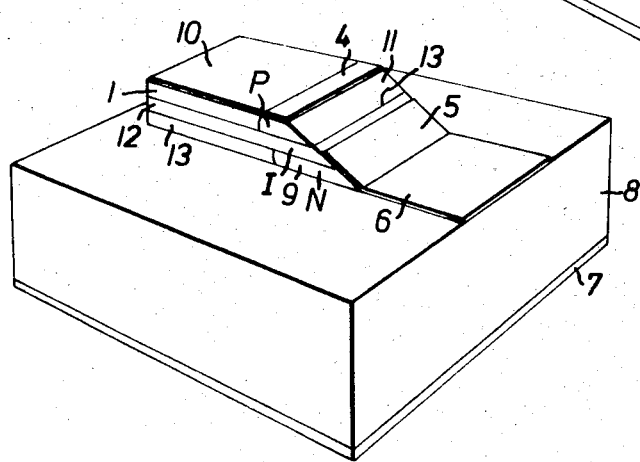
FIG. 3 is a view similar to FIG. 1 but showing a third embodiment of the invention.

With the arrangement according to FIG. 3 the diode with a PN junction is replaced by a so-called PIN diode, in which the centre diode region is an intrinsic conductive region. The semiconductor region bordering the electrode 4 is for example P-doped for this purpose, while the lower partial region 9 bordering the flank 13 is N-doped. The two diffusion fronts of the doped semiconductor regions 10 and 9 must be separated from each other by an intrinsic conductive semiconductor region 12 which is formed substantially by the centre semiconductor layer 2.

Figure 4:
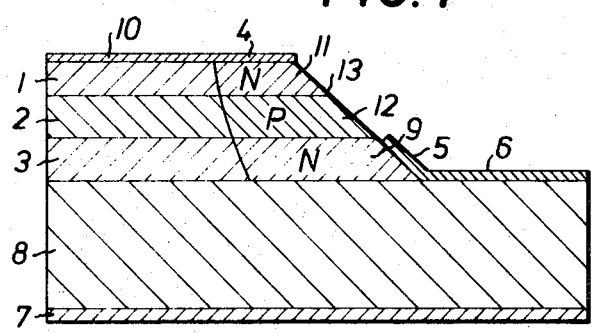
FIG. 4 is a sectional diagrammatic view of a fourth embodiment of the invention.

In FIG. 4 a semiconductor arrangement is shown, in which the detector comprises a phototransistor. This type of arrangement is particularly advantageous when the so-called "wide gap effect" in the phototransistor can also be exploited, this effect being produced in multi-layer semiconductor arrangements made of different semiconductive material. The "wide gap effect" brings about an extremely high degree of emitter efficiency so that large current amplifications may be achieved with this type of transistor. The current amplification factor amounts to 2000, for example. In this type of transistor the central layer 2 comprises silicon, for example, and forms the base area in the detector region. This base region 12 is weakly P-doped for example. A particularly favourable "wide gap effect" is produced if the emitter area 11 of the phototransistor, which is formed in the semiconductor layer 1 in the region of the detector, comprises gallium phosphide and is N-doped. The layer 3 may in this case comprise gallium phosphide for example, with this layer 3 being N-doped in the detector region and forming the collector 9 there. Only this collector 9 of the phototransistor and the emitter 11 are provided with connecting electrodes, while the base area 12 remains uncontacted. The emitter contact 4 is an ohmic connecting contact just as is collector contact 5 which is connected to the collector area 9 electrically at the flank 13 of the multi-layer semiconductor arrangement. In this arrangement too, the contacts 4 and 5 merge in turn into strip conductors 6 and 10, these forming a high-frequency strip line together with the conductor 7 arranged on the rear side of the substrate 8.

Finally it should also be pointed out that polycrystalline or amorphous semiconductive layers may also be used instead of the epitaxially deposited and monocrystalline semiconductor layers 1, 2 and 3, these polycrystalline or amorphous semiconductive layers being vapour deposited or sputtered on to the foundation member.

Moreover, the lowermost layer 3 may be dispensed with in certain circumstances if the dielectric constant of the material of the substrate 8 is smaller than that of the photoconductive layer 2. In this case the substrate 8 would replace the layer 3 since then the substrate also prevents light from escaping from the layer 2.

It will be understood that the above description of the present invention is susceptible to various modification changes and adaptations.

What is claimed is:

1. In an arrangement including a light wave conductor in which light is conducted through a first semiconductor layer disposed between second and third semiconductor layers having a smaller dielectric constant than that of said first semiconductor layer, and a detector coupled to said light wave conductor for detecting the conducted light; the improvement wherein: said second, first, and third semiconductor layers are disposed sequentially one above the other on a surface of a substrate; said light wave conductor has an edge surface which slopes toward said surface of said substrate; said detector is a semiconductor device formed at least partially within said three semiconductor layers adjacent said edge surface and extending to the upper surface of said third layer; and said detector has a first contact electrode disposed on said edge surface and a second contact electrode disposed on said upper surface of said third layer and adjacent said edge surface.

2. An arrangement as defined in claim 1 wherein said three semiconductor layers are substantially undoped away from the vicinity of said detector.

3. An arrangement as defined in claim 1, wherein said semiconductor layers are epitaxially produced and constructed in strip form; wherein said detector is arranged to one end of said strip with its electrodes, while the other end of said strip is provided for coupling the light supplied to the light wave conductor.

4. An arrangement as defined in claim 2 wherein said detector is a Schottky diode including a doped semiconductor region of a certain type of conductivity formed within said first, second and third layers adjacent said edge surface; and wherein one of said electrodes forms a rectifying metal-semiconductor contact with said semiconductor region, while the other of said electrodes forms an ohmic contact with said semiconductive region.

5. An arrangement as defined in claim 4, wherein the concentration of impurities of said doped semiconductor region decreases towards said substrate starting from the uppermost layer.

6. An arrangement as defined in claim 5, wherein said semiconductor region comprises a diffused region with a concentration of impurities at the upper surface of said third layer amounting to approximately $10^{18}$ atoms/cm$^3$ and decreasing constantly towards said substrate to approximately $10^{15}$–$10^{16}$ atoms/cm$^3$.

7. An arrangement as defined in claim 4 wherein said first electrode forms said rectifying metal-semiconductor contact.

8. An arrangement as defined in claim 2 wherein said detector is a p-n junction diode comprising a semiconductor region bordering said first electrode and of the first type of conductivity, a semiconductor region bordering said second electrode and of the opposite type of conductivity, and with a p-n junction forming a border between both said semiconductor regions; and wherein said electrodes are connected with the associated said semiconductor regions and are non rectifying ohmic contacts.

9. An arrangement as defined in claim 2 wherein said detector is a PIN diode comprising a semiconductor region bordering said first electrode and of the first type of conductivity, a semiconductor region bordering said second electrode and of the opposite type of conductivity, and a non-doped semi-insulating or intrinsically conductive semiconductor region separating said two semiconductor regions; and wherein said first and second electrodes are non rectifying ohmic contacts.

10. An arrangement as defined in claim 1 wherein at least in the regions adjacent said edge surface, said second semiconductor layer is of the first type of conductivity, said first semiconductor layer is of the second type of conductivity, and said third semiconductor layer is of said first type of conductivity; wherein said first electrode is an ohmic electrode only contacting the doped region of said second semiconductor layer; wherein said second electrode is an ohmic electrode arranged on the doped region of said third semiconductor layer; and wherein said first semiconductor layer remaining uncontacted.

11. An arrangement as defined in claim 1, wherein said first semiconductor layer provided for the photoconduction comprises GaAs or $Ga_{0.9}Al_{0.1}As$, and the two bordering semiconductor layers comprise $Ga_{0.7}Al_{0.3}As$.

12. An arrangement as defined in claim 1 wherein the individual semiconductor layers have a thickness of approximately 0.5 µm.

13. An arrangement as defined in claim 1, wherein said substrate comprises semi-insulating GaAs.

14. An arrangement as defined in claim 1, wherein said first electrode extends to the surface of said substrate as a strip conductor and a conductor strip running parallel thereto is arranged on the opposite surface of said substrate so that said substrate forms a dielectric of a strip line.

* * * * *